United States Patent [19]

Ponjee et al.

[11] Patent Number: 4,529,618

[45] Date of Patent: Jul. 16, 1985

[54] METHOD OF PHOTOLITHOGRAPHICALLY TREATING A SUBSTRATE

[75] Inventors: Johannes J. Ponjee; Franciscus J. B. Smolders; Christiaan J. A. Verwijlen, all of Eindhoven, Netherlands

[73] Assignee: U.S. Philips Corporation, New York, N.Y.

[21] Appl. No.: 538,388

[22] Filed: Oct. 3, 1983

[30] Foreign Application Priority Data

Oct. 15, 1982 [NL] Netherlands .................... 8203980

[51] Int. Cl.$^3$ ............................................. H01L 21/312
[52] U.S. Cl. .................................... 427/82; 427/96; 427/259; 430/327; 430/935
[58] Field of Search ............... 427/82, 93, 96, 259; 430/327, 935

[56] References Cited

U.S. PATENT DOCUMENTS

| | | | |
|---|---|---|---|
| 3,788,895 | 1/1974 | Schimmer | 427/93 |
| 3,827,908 | 6/1974 | Johnson | 427/82 |
| 4,103,045 | 7/1978 | Lesaicherre | 427/82 |

OTHER PUBLICATIONS

Noll, *Chemistry and Technology of Silicones*, Academic Press, ©1968, pp. 174–179.

*Primary Examiner*—John D. Smith
*Attorney, Agent, or Firm*—Norman N. Spain

[57] ABSTRACT

The invention relates to a method of photolithographically treating a substrate, in which a surface of the substrate is treated at least at the area at which it consists of an inorganic material with an organosilicon compound.

In order to improve the adhesion of a photolacquer layer to be applied, the organosilicon compound used is a 3-aminopropyl-trialkoxysilane in the form of an aqueous solution.

5 Claims, No Drawings

METHOD OF PHOTOLITHOGRAPHICALLY TREATING A SUBSTRATE

BACKGROUND OF THE INVENTION

The invention relates to a method of photolithographically treating a substrate, in which a surface of the substrate, at least at the area at which the substrate consists of an inorganic material, is treated with an organosilicon compound in order to improve the adhesion of a photolacquer layer to be applied to the substrate.

In photolithographic process, after exposure and development of an applied photolacquer layer when using, for example, the developed photolacquer layer as an etching mask, patterns are etched into the substrate, or when using the developed photolacquer layer as an application mask for a substrate, a structure is applied to the part of the surface of the substrate not covered by the photolacquer layer with the aid of a so-called lift-off process.

A frequent problem in photolithographic treatments is unsatisfactory adhesion of the photolacquer layer to the substrate. This problem is the more serious as the patterns and structures to be manufactured have smaller dimensions, for example, dimensions of 1.5 $\mu$m, as have become usual in the modern semiconductor industry.

In order to improve the adhesion of the photolacquer layer, substrate are frequently pretreated with so-called primers, for example, an organosilicon compound, such as a chlorosilane. Silanes of this type, however, hydrolyse readily, while in the presence of moisture they form polycondensation products which are distributed irregularly over the surface, as a result of which the ultimate pattern definition is disturbed and it is difficult to remove the polycondensation product from the surface in a homogeneous manner.

The usual primers are moreover toxic and corrosive.

SUMMARY OF THE INVENTION

The invention has inter alia for its object to avoid at least to a large extent the problems mentioned above.

The invention is based inter alia on the recognition of the fact that the influence of the hydrolysis of the organosilicon compound on the procedure can be neutralized by a suitable choice of the substituents of the organosilicon compound.

According to the invention, the method mentioned in the preamble is therefore characterized in that the substrate is treated with an aqueous solution containing less than 30 g per litre of a 3-aminopropyltrialkoxysilane corresponding to the formula

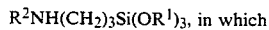

$R^2NH(CH_2)_3Si(OR^1)_3$, in which $R^1 = CH_3$ or $C_2H_5$ and $R^2 = H$, an alkyl group or $(CH_2)_mNHR^3$, where $m = 1$, 2 or 3 and $R^3n = H$ or alkyl.

It has been found that photolacquer layers adhere satisfactorily to surfaces treated by means of the method in accordance with the invention so that structures of small dimensions, for example, of 1.5 $\mu$m, can be obtained by photo-etching and lift-off processes in an accurate and reproducible manner.

The solutions used as primers in a method in accordance with the invention are neither toxic nor corrosive.

With concentrations higher than the said concentrations, satisfactory results are not obtained.

Preferably, at least 2.5 g of the 3-aminopropyltrialkoxysilane are dissolved in 1 liter of water. Such a solution can be used many times even for wet slices.

Especially favourable results are obtained if the substrate comprises at the area of the treated surface a substance belonging to the group consisting of silicon dioxide, silicon nitride, aluminum, monocrystalline silicon, polycrystalline silicon, indium oxide, tin oxide and glass.

As the alkoxysilane, use is preferably made of N-(2-amino ethyl)-3-aminopropyltrialkoxysilane or un-substituted 3-aminopropyltrialkoxysilane. Very satisfactory results are obtained with these compounds.

Means used hitherto for improving the adhesion of photolacquer layers (so-called primers) hydrolyse in the presence of water and give rise to problems due to polycondensation. The compounds used in the method according to the invention also hydrolyse immediately in an excess of water to the corresponding silane triols but exhibit the phenomenon of polycondensation at most to a very small extent and remain soluble in water at least for many months.

DESCRIPTION OF THE PREFERRED EMBODIMENT

The invention will now be described with reference to a number of examples.

A silicon wafer on which is disposed a layer of silicon dioxide having a thickness of 0.2 $\mu$m is cleaned in fuming nitric acid and rinsed with de-ionized water.

Subsequently, the wafer is immersed for at least 10 minutes at a temperature below 25° C. in a solution in water obtained by dissolving 2.5 to 10 g of N-(2-aminoethyl)-3-aminopropyltrimethoxysilane in 1 liter of water.

The wafer is then rinsed with de-ionized water for 2 minutes, dried and heated for 30 minutes at 200° C.

In a usual manner, a positive photolacquer layer of the diazoquinone type is applied, which consists, for example, of HPR 204 of Messrs. Hunt or of AZ 1350 of Messrs. Shipley.

By exposure through a mask and development, a pattern is formed in the photolacquer layer, the photolacquer being removed at the exposed areas when using a positive photolacquer layer.

At these areas, the silicon dioxide is removed by wet chemical etching in a hydrogen fluoride-containing etchant, such as a solution of hydrogen fluoride buffered with ammonium fluoride.

Subsequently, the remaining photolacquer is removed in acetone or in an oxygen-containing plasma.

The pattern definition in the silicon dioxide layer is about 1.5 $\mu$m and is attained in a simple manner.

With the same result, 3-aminopropyltriethoxysilane may be used instead of the said silane. In both cases mentioned, both the trimethoxy and the triethoxysilane may be used.

Further, the said adhesion layers and the photolacquers may be applied to a substrate at the area at which it consists of polysilicon and this substrate may be etched in a plasma containing fluorocarbon radicals.

Substrates, which consist at their surface of silicon nitride or a glass, for example, phosphosilicate, or aluminum, may also be treated in an analogous manner by means of the method in accordance with the invention and this may yield an analogously favourable result.

The invention is not limited to the examples given. It will be clear to those skilled in the art that the method described can be modified in many ways without departing from the scope of the invention.

What is claimed is:

1. A method of photolithographically treating a substrate, at least part of the surface area of which consists of an inorganic material, in which said surface of the substrate is treated, at least at the area at which the substrate consists of an inorganic material, with an organosilicon compound in order to improve the adhesion of a photolacquer layer to be applied, characterized in that the substrate is treated with an aqueous solution containing less than 30 g per liter of a 3-aminopropyltrialkoxysilane corresponding to the formula $R^2NH(CH_2)_3Si(OR^1)_3$, in which $R^1$ is $CH_3$ or $C_2H_5$ and $R^2$=H, an alkyl group or $(CH_2)_mNHR_3$, where m=1, 2 or 3 and $R^3$=H or alkyl.

2. A method as claimed in claim 1, characterized in that in the aqueous solution at least 2.5 g of the 3-aminopropyltrialkoxysilane are dissolved in 1 liter of water.

3. A method as claimed in claim 2, characterized in that the organosilicon compound used is N-(2-amino ethyl)-3-aminopropyltrialkoxysilane.

4. A method as claimed in claim 2, characterized in that the organosilicon compound used is unsubstituted 3-aminopropyltrialkoxysilane.

5. A method as claimed in claim 1, characterized in that the substrate comprises at the area of the treated surface a substance belonging to the group consisting of silicon dioxide, silicon nitride, aluminum, monocrystalline silicon, polycrystalline silicon, indium oxide, tin oxide and glass.

* * * * *